United States Patent
Kao et al.

(10) Patent No.: US 11,282,762 B2
(45) Date of Patent: Mar. 22, 2022

(54) HEAT SINK DESIGN FOR FLIP CHIP BALL GRID ARRAY

(71) Applicant: Marvell Asia Pte, Ltd., Singapore (SG)

(72) Inventors: Huahung Kao, San Jose, CA (US); Chenglin Liu, Cupertino, CA (US)

(73) Assignee: Marvell Asia Pte, Ltd., Singapore (SG)

( * ) Notice: Subject to any disclaimer, the term of this patent is extended or adjusted under 35 U.S.C. 154(b) by 0 days.

(21) Appl. No.: 16/784,869

(22) Filed: Feb. 7, 2020

(65) Prior Publication Data
US 2020/0258807 A1 Aug. 13, 2020

Related U.S. Application Data

(60) Provisional application No. 62/803,204, filed on Feb. 8, 2019.

(51) Int. Cl.
*H01L 23/367* (2006.01)
*H01L 23/498* (2006.01)
*H01L 23/00* (2006.01)

(52) U.S. Cl.
CPC .... *H01L 23/3672* (2013.01); *H01L 23/49816* (2013.01); *H01L 24/13* (2013.01)

(58) Field of Classification Search
CPC .................................................. H01L 23/3672
See application file for complete search history.

(56) References Cited

U.S. PATENT DOCUMENTS

| | | | |
|---|---|---|---|
| 6,724,080 | B1 | 4/2004 | Ooi et al. |
| 2006/0103014 | A1* | 5/2006 | Huang ............... H01L 23/3128 257/712 |
| 2007/0296079 | A1* | 12/2007 | Huang ............... H01L 23/4334 257/712 |
| 2008/0308926 | A1* | 12/2008 | Hung .................. H01L 23/3135 257/706 |
| 2009/0283902 | A1 | 11/2009 | Bezama et al. |
| 2010/0041181 | A1* | 2/2010 | Huang ............... H01L 21/6835 438/113 |
| 2010/0276799 | A1* | 11/2010 | Heng ..................... H01L 23/36 257/704 |
| 2014/0002989 | A1 | 1/2014 | Ahuja et al. |
| 2018/0261528 | A1* | 9/2018 | Chen ....................... H01L 23/16 |

FOREIGN PATENT DOCUMENTS

| | | |
|---|---|---|
| EP | 3373331 A1 | 9/2018 |
| WO | WO-2013089780 A1 | 6/2013 |

OTHER PUBLICATIONS

Extended European Search Report issued in corresponding European Application No. 20156122.2 dated Jun. 19, 2020.

* cited by examiner

*Primary Examiner* — William A Harriston

(57) ABSTRACT

A flip chip ball grid array (FCBGA) comprises a substrate, a cavity forming ring stiffener, an external heat sink, and a thermal interface material. The cavity forming ring stiffener is disposed on the substrate. The cavity forming ring stiffener has a segment which forms a cavity with the substrate, and exposes a top of the silicon chip. The external heat sink is disposed on the silicon chip and the segment of the cavity forming ring stiffener. A thermal interface material separates the segment of the cavity forming ring stiffener and the top of the silicon chip from the external heat sink and conducts heat from the silicon chip to the external heat sink.

22 Claims, 7 Drawing Sheets

HEAT SINK DESIGN FOR FLIP CHIP BALL
GRID ARRAY

CROSS REFERENCE TO RELATED
APPLICATION

This disclosure claims the benefit of priority of U.S. Provisional Application Ser. No. 62/803,204 filed Feb. 8, 2019, entitled, "EXPOSED-DIE HEAT-SINK DESIGN", the contents of which is incorporated herein by reference in its entirety.

FIELD OF USE

This disclosure relates to a heat sink design for a flip chip ball grid array (FCBGA), namely an external heat sink disposed on a cavity forming ring stiffener which forms a cavity with a substrate of the FCBGA. The cavity forming ring stiffener supports the external heat sink, exposes a top of a silicon chip on the FCBGA, and adds mechanical rigidity to the FCBGA.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

A flip chip ball grid array (FCBGA) is a semiconductor packaging which has a silicon chip disposed on one side of a substrate and a ball grid array disposed on another side of the substrate. The ball grid array enables mounting of the FCBGA on a printed circuit board. The silicon chip generates heat during operation. The heat needs to be dissipated away from the silicon chip to a fluid medium such as air, so that the silicon chip operates at an optimal temperature.

SUMMARY

This disclosure relates to a heat sink design for a flip chip ball grid array (FCBGA), namely an external heat sink which is disposed on a cavity forming ring stiffener which forms a cavity with a substrate of the FCBGA. The cavity forming ring stiffener supports the external heat sink, exposes a top of a silicon chip on a substrate of the FCBGA, and adds mechanical rigidity to the substrate of the FCBGA. Heat is transferred from the silicon chip to the external heat sink for dissipation into a fluid medium such as air via a layer of thermal interface material which separates the silicon chip and the cavity ring stiffener from the external heat sink.

Aspects of the disclosure provide a flip chip ball grid array (FCBGA) comprising: a substrate having a silicon chip; a cavity forming ring stiffener disposed on the substrate, the cavity forming ring stiffener having a segment which forms a cavity with the substrate and exposes a top of the silicon chip; a thermal interface material disposed on the segment of the cavity forming ring stiffener and the silicon chip; and an external heat sink disposed on the thermal interface material.

In one example, a segment exposes a portion of the top of the silicon chip. In another example, a height of the segment of the cavity forming ring stiffener is lower or higher than a height of the silicon chip. In yet another example, the segment is a first segment, the cavity forming ring stiffener comprises a second segment disposed along a periphery of the substrate, the second segment transitioning to the first segment by a step transition. In another example, the cavity forming ring stiffener has a uniform height from a periphery of the substrate toward a center of the substrate. In yet another example, the segment is a first segment, the cavity forming ring stiffener comprising a second segment affixed to the first segment. In another example, the second segment is disposed along the periphery of the substrate. In yet another example, the thermal interface material is a thermal grease or a thermally conductive pad. In another example, a height of the segment of the cavity forming ring stiffener is the same as a height of the silicon chip. In yet another example, the segment has a length which exposes a region on the substrate having an integrated circuit or probe pad. In another example, the external heat sink comprises one or more fins perpendicular to the segment of the cavity forming ring stiffener. In yet another example, the external heat sink comprises a recess or protrusion on a bottom of the external heat sink, the recess or the protrusion being over the silicon chip.

Aspects of the disclosure provide a method comprising: disposing a cavity forming ring stiffener on a substrate of a flip chip ball grid array (FCBGA), the cavity forming ring stiffener having a segment which forms a cavity with the substrate and exposes a top of a silicon chip on the substrate; disposing a thermal interface material on the segment of the cavity forming ring stiffener and the top of the silicon chip; and disposing an external heat sink on the thermal interface material.

In one example, a segment exposes a portion of the top of the silicon chip. In another example, the method of disposing the cavity forming ring stiffener on the substrate comprises disposing the segment of the cavity forming ring stiffener at a lower or higher height than the silicon chip. In yet another example, a thickness of the thermal interface material is uniform. In another example, the external heat sink comprises a recess or protrusion on a bottom of the external heat sink, the recess or the protrusion being over the silicon chip. In yet another example, the segment is a first segment, the method further comprising affixing the first segment to a second segment disposed along a periphery of the substrate. In another example, the segment is a first segment, the cavity forming ring stiffener comprising a second segment disposed along a periphery of the substrate, the second segment transitioning to the first segment by a step transition. In yet another example, the method further comprises mounting the FCBGA on a printed circuit board.

Figure 1C:
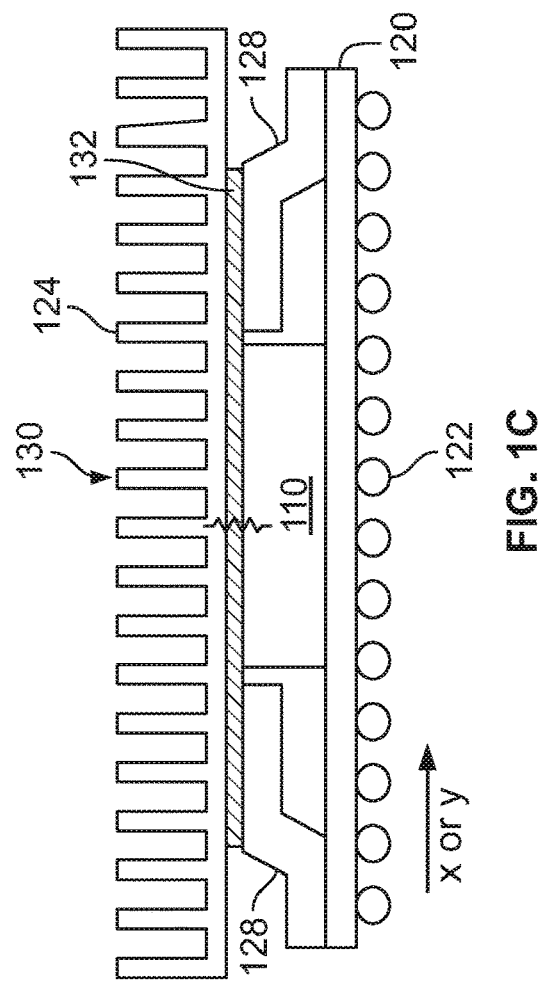
FIGS. 1A-1C illustrate various example views of an example flip chip ball grid array (FCBGA) with an example heat sink design.

The drawings are for the purpose of illustrating example embodiments, but it is understood that the embodiments are not limited to the arrangements and instrumentality shown in the drawings.

DETAILED DESCRIPTION

The description that follows includes example systems, methods, techniques, and program flows that embody aspects of the disclosure. However, it is understood that this disclosure may be practiced without these specific details. For instance, this disclosure relates to an example heat sink design for a flip chip ball grid array (FCBGA), namely an external heat sink and a cavity forming ring stiffener which forms a cavity with a substrate of the FCBGA. Aspects of this disclosure can be applied to semiconductor packaging other than an FBGA and, in other instances, well-known instances, structures, and techniques have not been shown in detail in order not to obfuscate the description.

Overview

An FCBGA arranged with a heat spreader and an external heat sink dissipates heat away from a silicon chip on the FCBGA to a fluid medium such as air, so that the silicon chip operates at an optimal temperature. The heat spreader is arranged over the silicon chip of the FCBGA to entirely cover a top of the silicon chip with supporting ends of the heat spreader coupled to a substrate of the FCBGA. Further, a first layer of thermal interface material such as thermal grease is disposed in between the silicon chip and the heat spreader to transfer heat from the silicon chip to the heat spreader. To dissipate the heat into the air, the external heat sink contacts the heat spreader via a second layer of thermal interface material such as a thermally conductive pad to transfer the heat from the heat spreader to the external heat sink. The external heat sink includes one or more plates such as fins that are oriented perpendicular to the heat spreader to allow the heat to flow into the fins for dissipation into the air.

The heat flowing from the silicon chip to the heat spreader via the first layer of thermal interface material is a bottleneck to transferring the heat from the silicon chip to the external heat sink. To reduce this bottleneck, a heat sink design is disclosed for the FCBGA. The heat sink design has an external heat sink and a cavity forming ring stiffener which forms a cavity with a substrate of the FCBGA. The cavity forming ring stiffener supports the external heat sink, exposes a silicon chip on a substrate of the FCBGA, and adds mechanical rigidity to a substrate of the FCBGA. The external heat sink may be disposed on the cavity forming ring stiffener and a silicon chip of the FCBGA with a layer of thermal interface material separating the cavity ring stiffener and the silicon chip from the external heat sink. Heat is transferred from the silicon chip to the external heat sink via the layer of the thermal interface material for dissipation into a fluid medium such as air.

The disclosed heat sink structure eliminates the layer of thermal interface material between a heat spreader and silicon chip needed to manage heat on the FCBGA and reduces a junction to case (e.g., silicon chip to external heat sink) thermal resistance. The heat from the silicon chip is not transferred from the silicon chip to the heat spreader via the first layer of thermal interface material and then from the heat spreader to the external heat sink via the second layer of thermal interface material. Instead the heat is transferred from the silicon chip to the external heat sink via a single layer of thermal interface material. The disclosed external heat sink for the FCBGA provides other advantages as well.

Example Illustrations

Figure 1A:
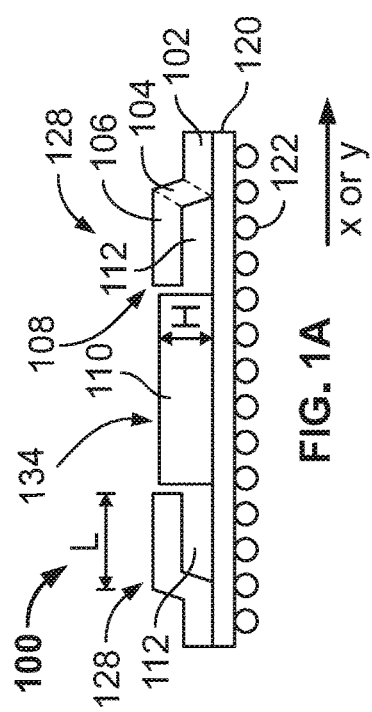
Figure 1B:
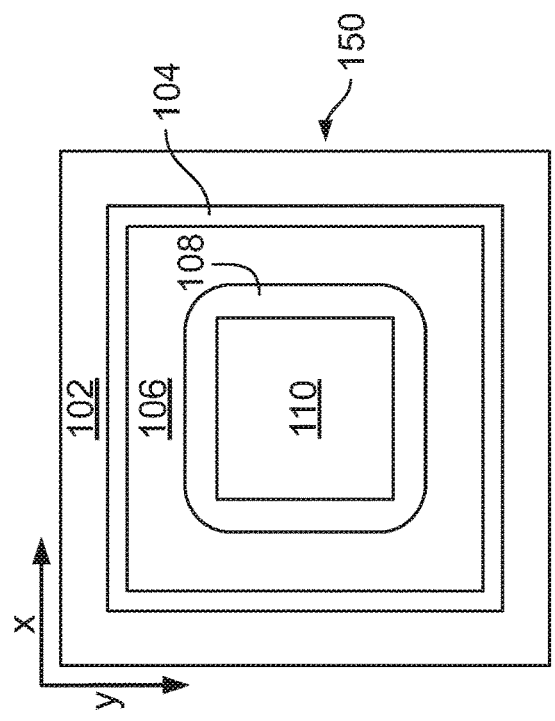

FIGS. 1A-1C illustrate various example views of an example flip chip ball grid array (FCBGA) with an example heat sink design. FIG. 1A and FIG. 1B show a side view 100 and a top view 150, respectively, of a cavity forming ring stiffener 128 of the FCBGA. Further, FIG. 1C shows an external heat sink 130 of the FCBGA which is disposed on the cavity forming ring stiffener 128. The views associated with FIG. 1A and FIG. 1C may be associated with an x or y dimension which may be the same assuming symmetry of the FCBGA, but in other examples views may differ depending on dimension. Similar components in the views are labeled with similar reference numbers.

The FCBGA has a silicon chip 110 disposed on one side of a substrate 120 and a ball grid array 122 disposed on other side of the substrate 120. The silicon chip 110 may be an integrated circuit disposed on the substrate 120 using a controlled collapse chip connection. The controlled collapse chip connection, or its abbreviation, C4, is a method for interconnecting semiconductor devices such as the silicon chip 110 to circuitry such as the substrate 120 with solder bumps that have been deposited onto chip pads. The ball grid array 122 which is disposed on other side of the substrate 120 is a type of surface-mount packaging used for integrated circuits. The ball grid array 122 allows for surface mounting the FCBGA to a printed circuit board (not shown).

The silicon chip 110 may generate heat during operation. So that the silicon chip operates at an optimal temperature, the external heat sink 130 may be disposed on the cavity forming ring stiffener 128 and the silicon chip 110. The external heat sink 130 may transfer the heat generated by the silicon chip 110 during operation to a fluid medium such as air for dissipation away from the silicon chip 110.

The cavity forming ring stiffener 128 may be a rigid one-piece structure made of a metal such as copper with nickel plating or with aluminum. The cavity forming ring stiffener 128 may be defined by a first segment 102, a step transition 104 or downstep, and a second segment 106, each of which are separated by dotted lines. Further, the first segment 102, the step transition 104 or downstep, and the second segment 106 are shown for one side of the cavity forming ring stiffener 128 for ease of illustration but both sides of the cavity forming ring stiffener 128 may be composed similarly. The first segment 102, the step transition 104 or downstep, and the second segment 106 may each have a thickness ranging from 0.3 to 4 mm in examples. At least the second segment 106 and the substrate 120 may form a cavity 112 and in examples the first segment 102 may be lower than the second segment 106. The first segment 102 may be disposed along a periphery of the substrate 120 to support the cavity forming ring stiffener and the second segment 106 may be oriented substantially parallel to the substrate 120 with a height H. The step transition 104 may facilitate a transition from the first segment 102 to the second segment 106 which are at different heights. The second segment 106 with length L may expose the top 134 of the silicon chip 110 as shown in the top view 150. The exposure may be that the segment 106 covers a portion of the top 134 or does not cover the top 134 at all. In examples, the length L of the second segment 106 may define a slot 108 between the silicon chip 110 and the second segment 106 in the top view 150.

The cavity forming ring stiffener 128 further supports the external heat sink 130 and adds mechanical rigidity to prevent warpage of the substrate 120. The rigidity is increased compared to a ring structure which does not form the cavity 112. The external heat sink 130 shown in FIG. 1C along with the cavity forming ring stiffener 128 may also be made of various metals such as copper with nickel plating or aluminum. The external heat sink 130 may be disposed on the second segment 106 of the cavity forming ring stiffener 128 and on top 134 of the silicon chip 110 and separated by a layer of thermal interface material 132. In examples, the layer of the thermal interface material 132 may have a uniform thickness. The thermal interface material 132 may be a material with a thermal resistance which facilitates conduction of heat, such as a thermal grease with a silicon-based filler or a thermally conductive pad such as a graphite pad with a thickness in a range of tens of microns. Thermal grease (also called heat paste, heat sink compound, heat sink paste, thermal compound, thermal gel, thermal interface material, or thermal paste) is a thermally conductive (but usually electrically insulating) compound. A role of thermal grease may be to eliminate air gaps or spaces (which act as thermal insulation) from an interface area in order to maximize heat transfer and dissipation. The thermal interface material 132 may conduct the heat from the silicon chip 110 which is exposed by the cavity forming ring stiffener 128 to the external heat sink 130. To dissipate the heat into the air, the external heat sink 130 may include one or more plates 124 on a top of the external heat sink 130 such as fins. In some examples, the fins may be oriented perpendicular to the second segment 106 of the cavity forming ring stiffener 128. The heat flows from the silicon chip 110, through the thermal interface material 132, and the plates 124 of the external heat sink 130 for dissipation into the air.

The second segment 106 of the cavity forming ring stiffener 128 may have the length L which exposes the top 134 of the silicon chip 110 in different amounts. In some examples, the length L of the second segment 106 of the cavity forming ring stiffener 128 may be sized so that the second segment 106 does not cover the top 134 of the silicon chip 110 and does not cover a region on the substrate 120 adjacent to the silicon chip 110. The region is not covered, allowing for access to the region from above so long as the external heat sink 130 and thermal interface material 132 is not disposed on the cavity forming ring stiffener 128.

Figure 2A:
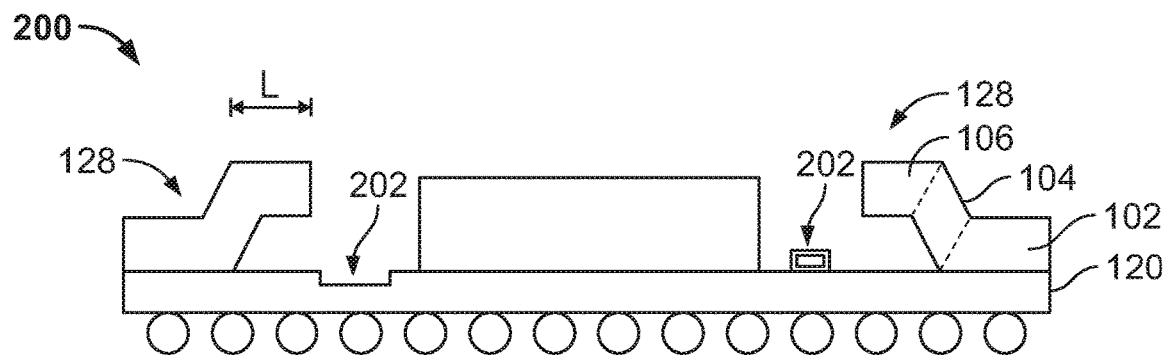
FIGS. 2A and 2B illustrate an example top view and an example side view of the example FCBGA having an example cavity forming ring stiffener which does not cover a region on a substrate of the example FCBGA.
Figure 2B:
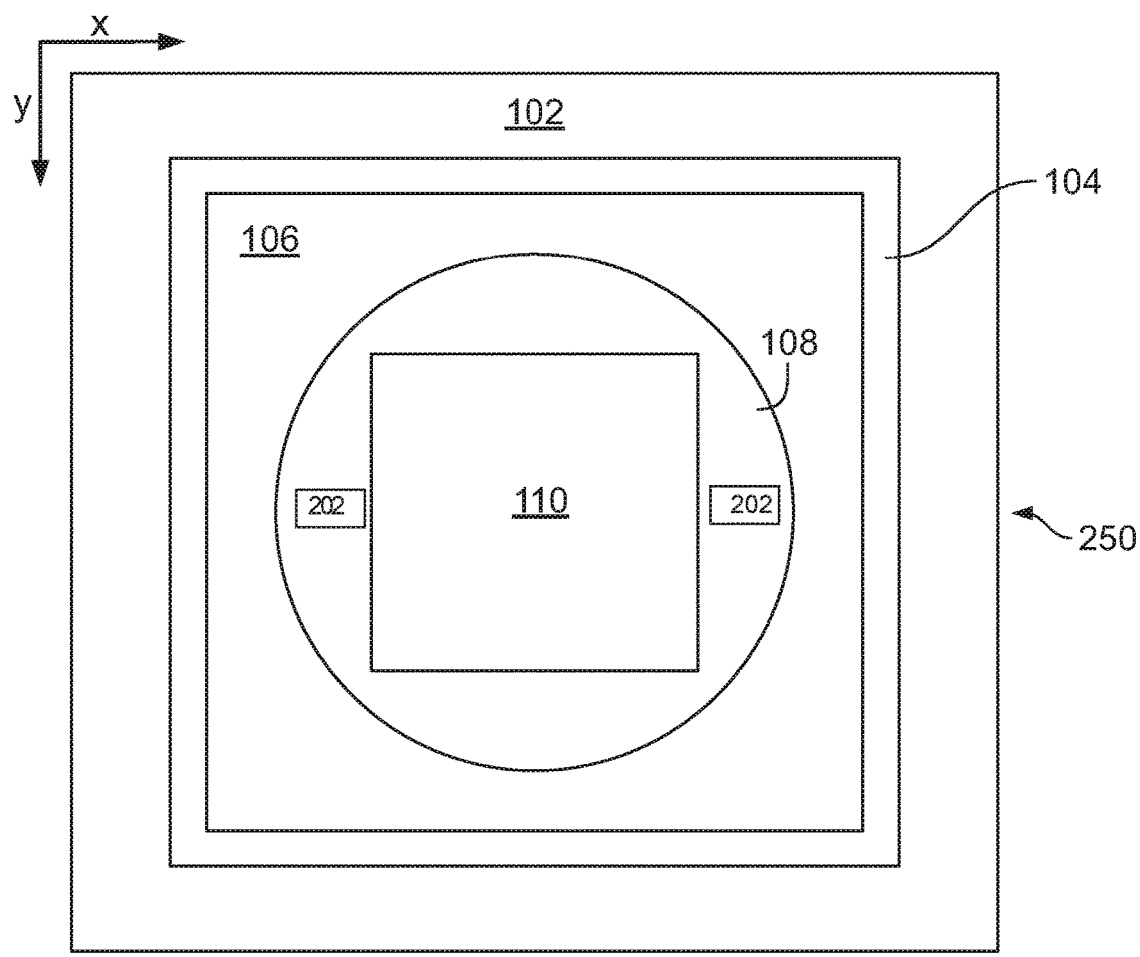

FIGS. 2A and 2B illustrate an example side view 200 and an example top view 250 of the example FCBGA having the example cavity forming ring stiffener 128 with the second segment 106 which does not cover a region 202 on the substrate 120 of the example FCBGA. In examples, the region 202 may have a probe pad coupled to the silicon chip 110 to probe the silicon chip 110 and/or integrated circuitry. The second segment 106 of the cavity forming ring stiffener 128 may have a length L so as to not extend above the region 202 to cover the region 202. Further, the second segment 106 may not cover the top of the silicon chip 110. The slot 108 between the silicon chip 110 and the second segment 106 may take different shapes. The shape that is shown in the top view 250 is a circle indicating that the length L may vary along the x or y dimension around the silicon chip 110, but the shape may take other forms including a rectangle or oval. The slot 108 may allow for access to the region 202 from above when the external heat sink 130 (not shown) is not disposed on the cavity forming ring stiffener 128.

In the examples above, a height of the cavity forming ring stiffener 128 and a height of the top of the silicon chip 110 may be the same, e.g., the second segment 106 and the top of the silicon chip 110 are in a same plane. In other examples, the second segment 106 of the cavity forming ring stiffener 128 may be below or above the top of the silicon chip 110.

Figure 3A:
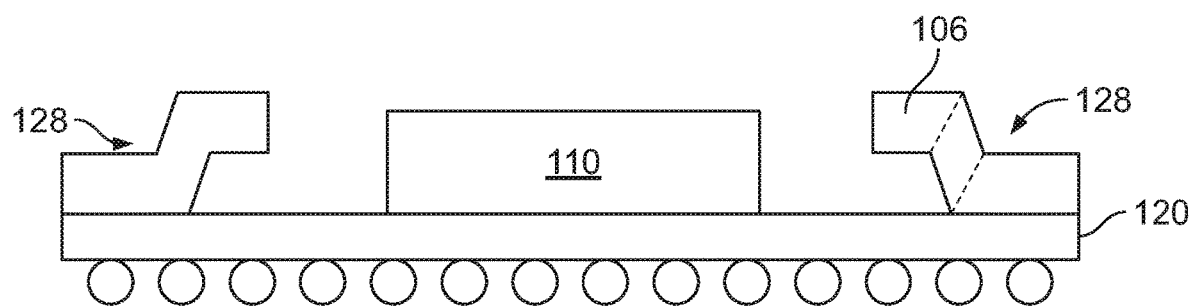
FIG. 3A-B illustrates example side views of example cavity forming ring stiffeners having different heights.
Figure 3B:
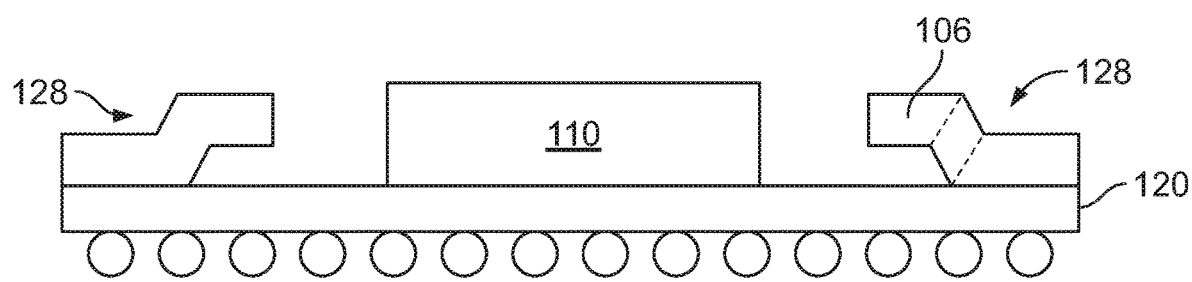

FIG. 3A-B illustrates example side views of example cavity forming ring stiffeners 128 with different heights. In FIG. 3A, the second segment 106 of the cavity forming ring stiffener 128 may be higher than the height of the silicon chip 110. In FIG. 3B, the second segment 106 of the cavity forming ring stiffener 128 may be lower than the height of the silicon chip 110. The external heat sink 130 may be modified to account for the difference in height between the top of the silicon chip 110 and the height of the second segment 106 of the cavity forming ring stiffener 128.

Figure 4:
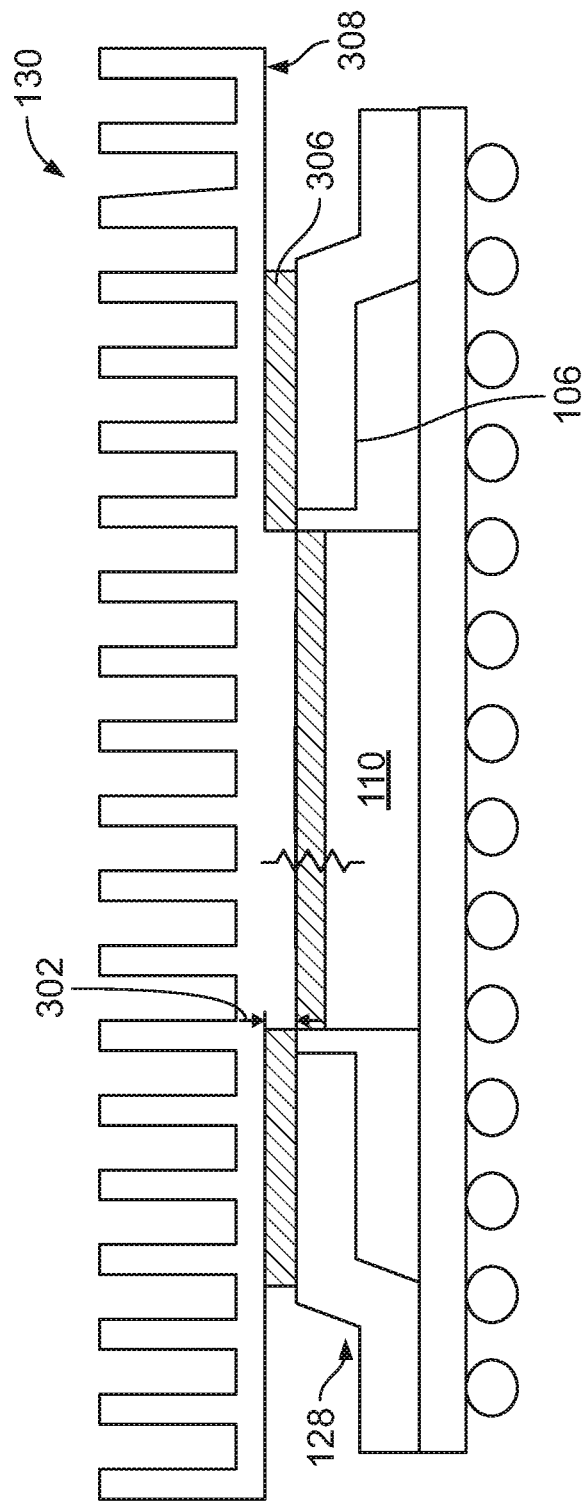
FIG. 4 illustrates an example side view of an example external heat sink disposed on the example cavity forming ring stiffener with the example cavity forming ring stiffener being higher than the silicon chip.

FIG. 4 illustrates an example side view of an example external heat sink 130 disposed on the example cavity forming ring stiffener 128 with the second segment 106 of the example cavity forming ring stiffener 128 being higher than the height of the silicon chip 110. A portion of the bottom 308 of the external heat sink 130 may be formed with a protrusion 302 over the silicon chip 110. The protrusion 302 may be made of the same material or different material than the external heat sink 130. A thermal interface material 306 may be disposed between the external heat sink 130 and the silicon chip 110 and between the external heat sink 130 and the second segment 106. The protrusion 302 may reduce a thickness of the thermal interface material 306 needed between the silicon chip 110 and the external heat sink 130 compared to the external heat sink 130 without the protrusion 302. For example, the thickness of the thermal interface material 306 between the silicon chip 110 and the thickness of the thermal material between the support 106 and the external heat sink 130 may be substantially the same or uniform when the external heat sink is disposed on the second segment 106 and the silicon chip 110. The second segment 106 being higher than the top of the silicon chip 110 may also allow for protection of the silicon chip 110 during handling of the FCBGA. Any impacts to the FCBGA will be absorbed by the example cavity forming ring stiffener 128 and not the silicon chip 110. If the second segment 106 of the example cavity forming ring stiffener 128 is lower than the height of the silicon chip 110, a portion of the bottom 308 of the external heat sink 130 may be formed with a recess over the silicon chip 110 (not shown). A thermal interface material 306 may be disposed between the external heat sink 130 and the silicon chip 110 and between the external heat sink 130 and the second segment 106. The recess on the bottom of the external heat sink 130 may provide space to increase a thickness of the thermal interface material between the silicon chip 110 and the external heat sink 130 compared to the external heat sink 130 without the recess. For example, the thickness of the thermal interface material 306 between the silicon chip 110 and the thickness of the thermal material between the support 106 and the external heat sink 130 may be substantially the same or uniform when the external heat sink is disposed on the second segment 106 and the silicon chip 110. Other variations are also possible.

Figure 5A:
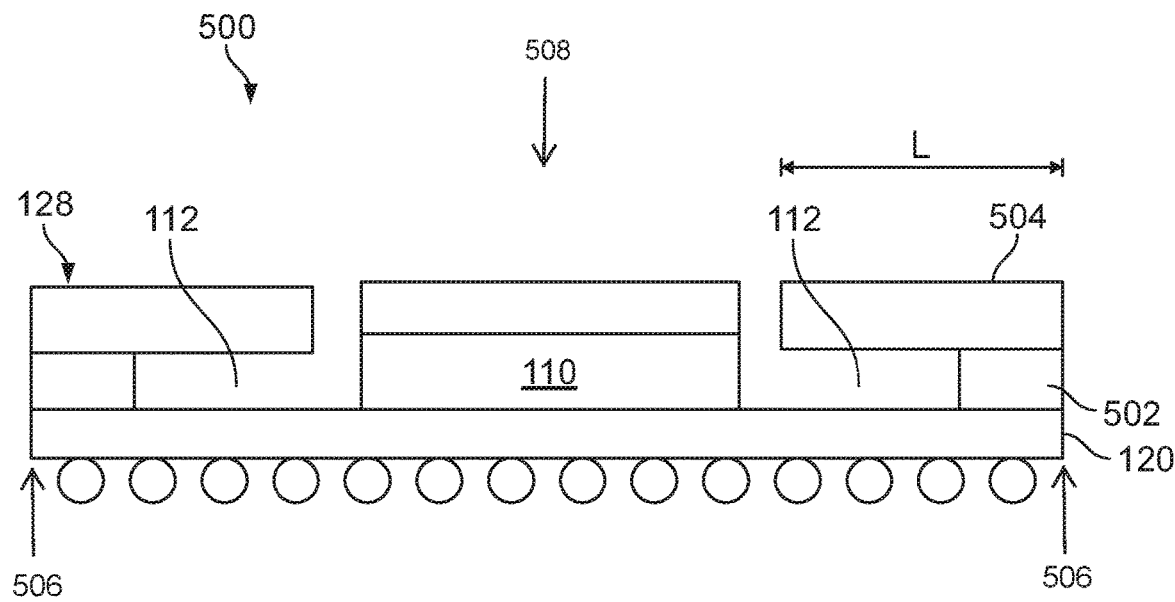
FIGS. 5A and 5B illustrate various examples view of an example cavity forming ring stiffener with uniform height.
Figure 5B:
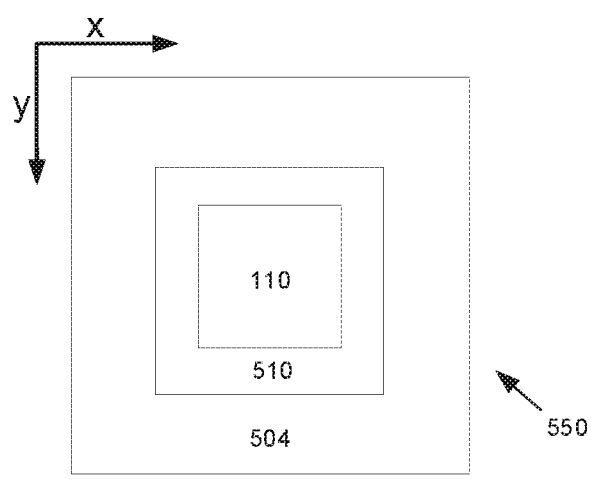

FIGS. 5A and 5B illustrate an example side view 500 and an example top view 550 of an example cavity forming ring stiffener 128 with uniform height which is disposed on the substrate 120 of the FCBGA. The views may be associated with an x or y dimension which may be the same assuming symmetry of the FCBGA, but in other examples the view may differ depending on dimension. The example cavity forming ring stiffener 128 may be a ridged one-piece structure defined by a first segment 502 and second segment 504.

The first segment 502 may be located along a periphery 506 of the substrate 120. The second segment 504 is shown to be at a same height as the top of the silicon chip 110, but may be lower or higher than the top of the silicon chip 110 in other examples. The second segment 504 may be oriented substantially parallel to the substrate 120 in a longitudinal direction of the view for length L to form the cavity 112. Additionally, the second segment 504 may be at a uniform height above the substrate 120 from the periphery 506 of the substrate 120 toward a center 508 of the substrate 120 with a slot 510 between the silicon chip 110 and the second segment 504. In examples, the external heat sink 130 (not shown) may be disposed on the second segment 504 of the cavity forming ring stiffener 128 with a thermal interface material separating the second segment 504 of the cavity forming ring stiffener 128 and the top of the silicon chip 110 from the external heat sink 130. An area of the second segment 504 to support the external heat sink 130 may be larger than an area of the second segment 106 because there is no step transition 104 in this example of the cavity forming ring stiffener 128. Further, the first segment 502 may have a thickness greater than the second segment 504 in some examples to increase stability of the cavity forming ring stiffener 128 in supporting the external heat sink 130.

In some examples, the cavity forming ring stiffener 128 may be made of a plurality of segments coupled together rather than the one-piece structure.

Figure 6:
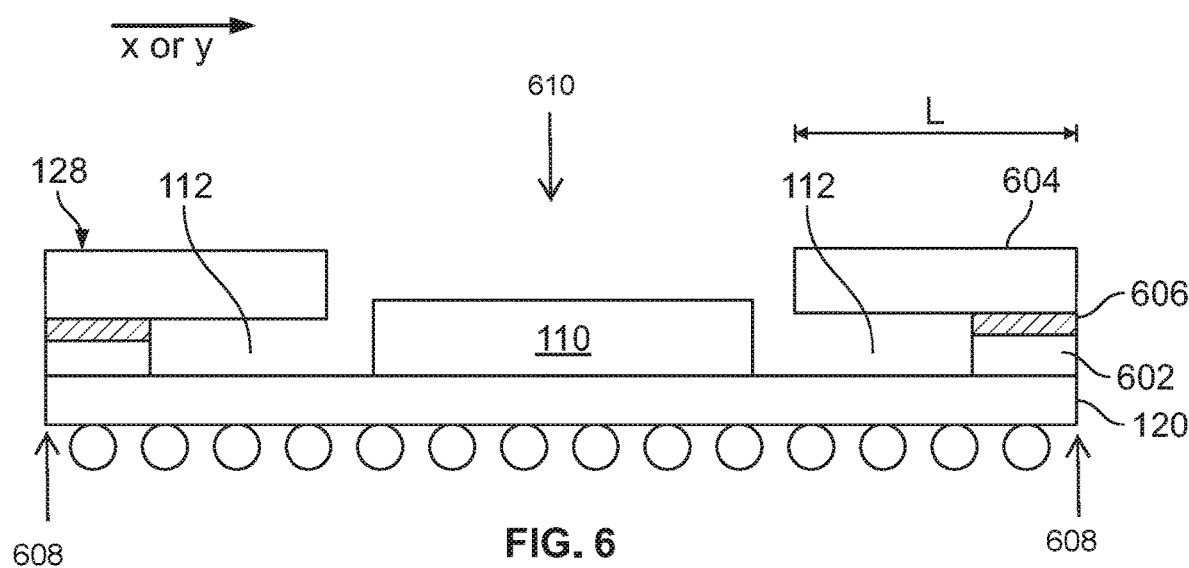
FIG. 6 illustrates an example side view of another example cavity forming ring stiffener with uniform height.

FIG. 6 illustrates an example side view of another example cavity forming ring stiffener 128 with uniform height. The example cavity forming ring stiffener 128 may be a ridged two-piece structure defined by a first segment 602 and second segment 604 which are affixed at an interface 606. The two segments 602, 604 may be affixed by an adhesive connection or mechanical connection, for example, at the interface 606. The segment 602 may be a conventional ring stiffener along a periphery 608 of the substrate 120 on top of which is disposed the segment 604 to form the cavity forming ring stiffener 128. The segment 604 may be oriented substantially parallel to the substrate 120 in a longitudinal direction of the view for length L. Further, the segment 604 may be at a uniform height above the substrate 120 from the periphery 608 of the substrate 120 toward a center 610 of the substrate 120. In examples, the external heat sink 130 (not shown) may be disposed on the segment 604 of the cavity forming ring stiffener 128, with a thermal interface material separating the silicon chip 110 and the segment 604 from the external heat sink 130. The segment 604 may be a support for the external heat sink 130.

In the above examples, the example cavity forming ring stiffener 128 is described as exposing the top 134 of the silicon chip 110. In other examples, the example cavity forming ring stiffener 128 may further contact the silicon chip 110, e.g., segments 106, 504, or 604 of the example cavity forming ring stiffener 128 contact the silicon chip 110. Contact with the silicon chip 110 may result in the example cavity forming ring stiffener 128 conducting heat from the silicon chip 110 to the substrate 120 of the FCBGA and from the silicon chip 110 to the external heat sink 130 via the thermal interface material 132.

Example Functions

Figure 7:
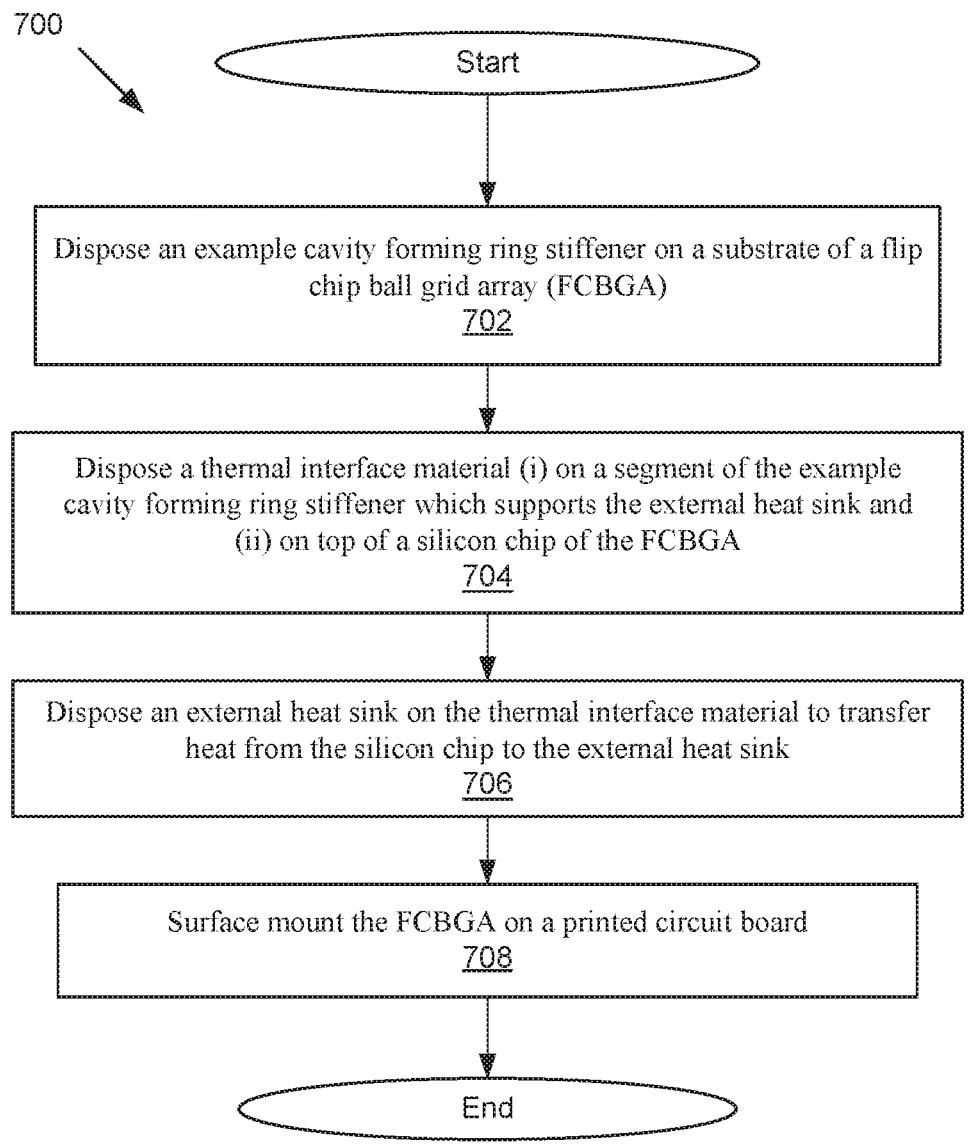
FIG. 7 is a flow chart of example functions associated with assembly of the example cavity forming ring stiffener and example external heat sink on a substrate of the FCGBA.

FIG. 7 is a flow chart 700 of example functions associated with assembly of the example cavity forming ring stiffener 128 and example external heat sink 130 on the FCGBA.

At 702, an example cavity forming ring stiffener 128 is disposed on a substrate 120 of the FCBGA. The example cavity forming ring stiffener 128 may expose the top of the silicon chip 110 of the FCBGA. The example cavity forming ring stiffener 128 may also define a cavity with respect to substrate 120. The example cavity forming ring stiffener 128 may be made of a metal such as copper plated with nickel or with aluminum.

At 704, a thermal interface material is disposed (i) on a segment of the example cavity forming ring stiffener 128 which functions to support an external heat sink 130 and (ii) on a top of the silicon chip 110 of the FCBGA. Examples of this segment of the example cavity forming ring stiffener are shown and described above. The thermal interface material 132 may be a thermal grease which has a silicon filler to improve thermal conductivity or other material such as a heat conductive pad which may be a multiple often microns thick in some examples.

At 706, the external heat sink 130 is disposed on the thermal interface material 132 to transfer heat from the silicon chip 110 to the external heat sink 130 via the thermal interface material 132. The external heat sink 130 may also have plates 124 such as fins to conduct the heat from the silicon chip 110 into the air.

At 708, the FCBGA is surface mounted on a printed circuit board. In examples, the ball grid array 122 of the substrate 120 may facilitate mounting the FCBGA to the printed circuit board.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A flip chip ball grid array comprising:
   a substrate comprising a ball grid array;
   a ring stiffener disposed on the substrate and forming a cavity with the substrate, the ring stiffener comprising an opening;
   a silicon chip disposed in the cavity and mounted on and contacting a side of the substrate opposite that of the ball grid array, the silicon chip exposed by the opening when the ring stiffener is attached to the substrate;
   a thermal interface material disposed on the silicon chip at the opening in the ring stiffener;
   an external heat sink disposed over the opening and on the thermal interface material; and
   a probe pad disposed on the substrate,
   wherein the opening of the ring stiffener is configured to expose a region on the substrate having the silicon chip and the probe pad, and
   provide access for probing the silicon chip via the probe pad.

2. The flip chip ball grid array of claim 1, wherein the thermal interface material contacts the silicon chip in the opening of the ring stiffener.

3. The flip chip ball grid array of claim 1, wherein:
   a height of the cavity is less than a height of the silicon chip; and the silicon chip extends at least partially into the opening of the ring stiffener.

4. The flip chip ball grid array of claim 1, wherein the ring stiffener comprises:
a first segment; and
a second segment disposed along a periphery of the substrate and transitioning to the first segment by a step transition.

5. The flip chip ball grid array of claim 4, wherein the second segment is disposed along the periphery of the substrate.

6. The flip chip ball grid array of claim 1, wherein the ring stiffener has a uniform height from a periphery of the substrate toward a center of the substrate and surrounds the silicon chip.

7. The flip chip ball grid array of claim 1, wherein the thermal interface material includes a thermal grease or is implemented as a thermally conductive pad.

8. The flip chip ball grid array of claim 1, wherein a height of the ring stiffener is equal to a height of the silicon chip.

9. The flip chip ball grid array of claim 1, wherein the external heat sink comprises one or more fins extending perpendicularly to a segment of the ring stiffener.

10. The flip chip ball grid array of claim 1, wherein:
the external heat sink comprises a protrusion extending into a recessed portion of the thermal interface material over the silicon chip; and
the recessed portion of the thermal interface material is disposed in the opening of the ring stiffener.

11. The flip chip ball grid array of claim 1, wherein a height of the cavity is greater than a height of the silicon chip.

12. The flip chip ball grid array of claim 11, wherein the thermal interface material is partially disposed in the opening of the ring stiffener.

13. The flip chip ball grid array of claim 1, wherein:
the thermal interface material contacts the silicon chip; and
the external heat sink contacts the thermal interface material and draws thermal energy from the silicon chip via the thermal interface material.

14. The flip chip ball grid array of claim 1, wherein:
the ring stiffener comprises a first segment and a second segment;
the first segment comprises the opening; and
the cavity is defined by a bottom surface of the first segment and a top surface of the substrate.

15. The flip chip ball grid array of claim 1, wherein:
the substrate comprises chip pads; and
the silicon chip comprises solder bumps disposed on and connected to the chip pads.

16. The flip chip ball grid array of claim 1, wherein the thermal interface material extends over the opening of the ring stiffener.

17. The flip chip ball grid array of claim 1, wherein the flip chip ball grid array is void of a heat spreader.

18. The flip chip ball grid array of claim 1, wherein the ring stiffener contacts the substrate.

19. A method comprising:
disposing a ring stiffener over a silicon chip and on a substrate of a flip chip ball grid array, the ring stiffener forming a cavity with the substrate and comprising an opening, and the opening exposing the silicon chip when the ring stiffener is attached to the substrate, wherein the silicon chip is disposed in the cavity and is mounted on the substrate;
disposing a thermal interface material at the opening in the ring stiffener and on the silicon chip;
disposing an external heat sink over the opening of the ring stiffener and on the thermal interface material;
disposing a probe pad on the substrate; and
via the opening of the ring stiffener,
exposing a region on the substrate having the silicon chip and the probe pad, and
providing access for probing the silicon chip via the probe pad.

20. The method of claim 19, wherein disposing the ring stiffener on the substrate comprises forming the cavity such that a height of the cavity is higher than a height of the silicon chip.

21. The method of claim 19, wherein disposing the thermal interface material at the opening in the ring stiffener is such that a thickness of the thermal interface material is uniform.

22. The method of claim 19, further comprising extending a protrusion of the external heat sink into a recessed portion of the thermal interface material over the silicon chip.

* * * * *